(12) United States Patent
Jung et al.

(10) Patent No.: US 10,932,368 B1
(45) Date of Patent: Feb. 23, 2021

(54) SUBSTRATE-EMBEDDED ELECTRONIC COMPONENT

(71) Applicant: SAMSUNG ELECTRO-MECHANICS CO., LTD., Suwon-si (KR)

(72) Inventors: Ha Yong Jung, Suwon-si (KR); Ho Hyung Ham, Suwon-si (KR); Jae Sung Sim, Suwon-si (KR); Won Seok Lee, Suwon-si (KR)

(73) Assignee: SAMSUNG ELECTRO-MECHANICS CO., LTD., Suwon-si (KR)

( * ) Notice: Subject to any disclaimer, the term of this patent is extended or adjusted under 35 U.S.C. 154(b) by 0 days.

(21) Appl. No.: 16/801,927

(22) Filed: Feb. 26, 2020

(30) Foreign Application Priority Data

Dec. 17, 2019 (KR) .................. 10-2019-0168945

(51) Int. Cl.
| | |
|---|---|
| *H01L 23/538* | (2006.01) |
| *H05K 1/18* | (2006.01) |
| *H05K 3/46* | (2006.01) |
| *H01L 21/48* | (2006.01) |
| *H01L 21/683* | (2006.01) |
| *H05K 1/11* | (2006.01) |
| *H05K 1/02* | (2006.01) |
| *H01L 23/367* | (2006.01) |
| *H01L 23/00* | (2006.01) |

(52) U.S. Cl.
CPC .......... *H05K 1/187* (2013.01); *H01L 21/486* (2013.01); *H01L 21/4853* (2013.01); *H01L 21/4857* (2013.01); *H01L 21/6835* (2013.01); *H01L 23/5383* (2013.01); *H01L 23/5386* (2013.01); *H01L 23/5389* (2013.01); *H05K 1/115* (2013.01); *H05K 3/4682* (2013.01); *H05K 3/4697* (2013.01); *H01L 23/367* (2013.01); *H01L 24/16* (2013.01); *H01L 24/32* (2013.01); *H01L 24/73* (2013.01); *H01L 2221/68345* (2013.01); *H01L 2221/68359* (2013.01); *H01L 2224/16225* (2013.01); *H01L 2224/32225* (2013.01); *H01L 2224/73204* (2013.01); *H05K 1/0206* (2013.01)

(58) Field of Classification Search
CPC ...... H05K 1/187; H05K 3/4697; H05K 1/115; H05K 3/4682; H01L 23/5386; H01L 21/4857; H01L 23/5389; H01L 23/5383
USPC ....................................................... 361/761
See application file for complete search history.

(56) References Cited

U.S. PATENT DOCUMENTS

| | | | |
|---|---|---|---|
| 2008/0196931 A1* | 8/2008 | Lee .................. | H01L 24/82 174/260 |
| 2017/0256497 A1* | 9/2017 | Mano ................ | H05K 1/183 |

FOREIGN PATENT DOCUMENTS

| | | |
|---|---|---|
| KR | 10-2014-0097322 A | 4/2014 |
| KR | 10-1384035 B1 | 4/2014 |

* cited by examiner

*Primary Examiner* — Sherman Ng
(74) *Attorney, Agent, or Firm* — Morgan, Lewis & Bockius LLP

(57) ABSTRACT

A substrate-embedded electronic component includes a first core layer, a first through-portion penetrating the first core layer, a first electronic component disposed in the first through-portion, an encapsulant disposed in at least a portion of the first through-portion, and covering at least a portion of the first electronic component, a second core layer disposed on the encapsulant, and a first through-via penetrating the second core layer, wherein the first through-via is connected to the first electronic component.

16 Claims, 12 Drawing Sheets

SUBSTRATE-EMBEDDED ELECTRONIC COMPONENT

CROSS-REFERENCE TO RELATED APPLICATION(S)

This application claims benefit of priority to Korean Patent Application No. 10-2019-0168945 filed on Dec. 17, 2019 in the Korean Intellectual Property Office, the disclosure of which is incorporated herein by reference in its entirety.

BACKGROUND

The present disclosure relates to a substrate-embedded electronic component.

Recently, an electronic device such as a mobile phone, a tablet PC, and the like is required to have miniaturization and thinning of a size thereof while retaining high performance. Accordingly, a technology for a substrate-embedded electronic component such as a passive element, an active element, and the like to be embedded in a printed circuit board has been developed.

Meanwhile, in the case of such a substrate-embedded electronic component, a problem such as a shortened lifespan, deterioration of performance, and the like of the electronic component due to heat generation of the embedded electronic component may occur. Therefore, a structure for dissipating heat from the substrate-embedded electronic component, which is embedded, is required.

SUMMARY

An aspect of the present disclosure is to provide a substrate-embedded electronic component having improved heat dissipation performance.

Another aspect of the present disclosure is to provide a substrate-embedded electronic component utilizing a region other than a region in which an electronic component in the substrate is mounted.

According to an aspect of the present disclosure, a substrate-embedded electronic component includes a first core layer, a first through-portion penetrating the first core layer, a first electronic component disposed in the first through-portion, an encapsulant disposed in at least a portion of the first through-portion and covering at least a portion of the first electronic component, a second core layer disposed on the encapsulant, and a first through-via penetrating the second core layer. The first through-via is connected to the first electronic component.

According to an aspect of the present disclosure, a substrate-embedded electronic component includes a core layer, a through-portion penetrating the core layer, an electronic component disposed in the through-portion, an encapsulant disposed in at least a portion of the through-portion, and covering at least a portion of the electronic component, a build-up layer disposed on an upper side of the encapsulant and including a metal layer connected to a pad of the electronic component, an insulating layer disposed on a lower side of the encapsulant opposing the upper side thereof, a through-via penetrating the insulating layer, and a conductive structure embedded in the encapsulant connecting the through-via and the electronic component to each other. The conductive structure and the metal layer are made of different materials.

BRIEF DESCRIPTION OF DRAWINGS

The above and other aspects, features, and advantages of the present disclosure will be more clearly understood from the following detailed description, taken in conjunction with the accompanying drawings, in which.

DETAILED DESCRIPTION

Figure 1:
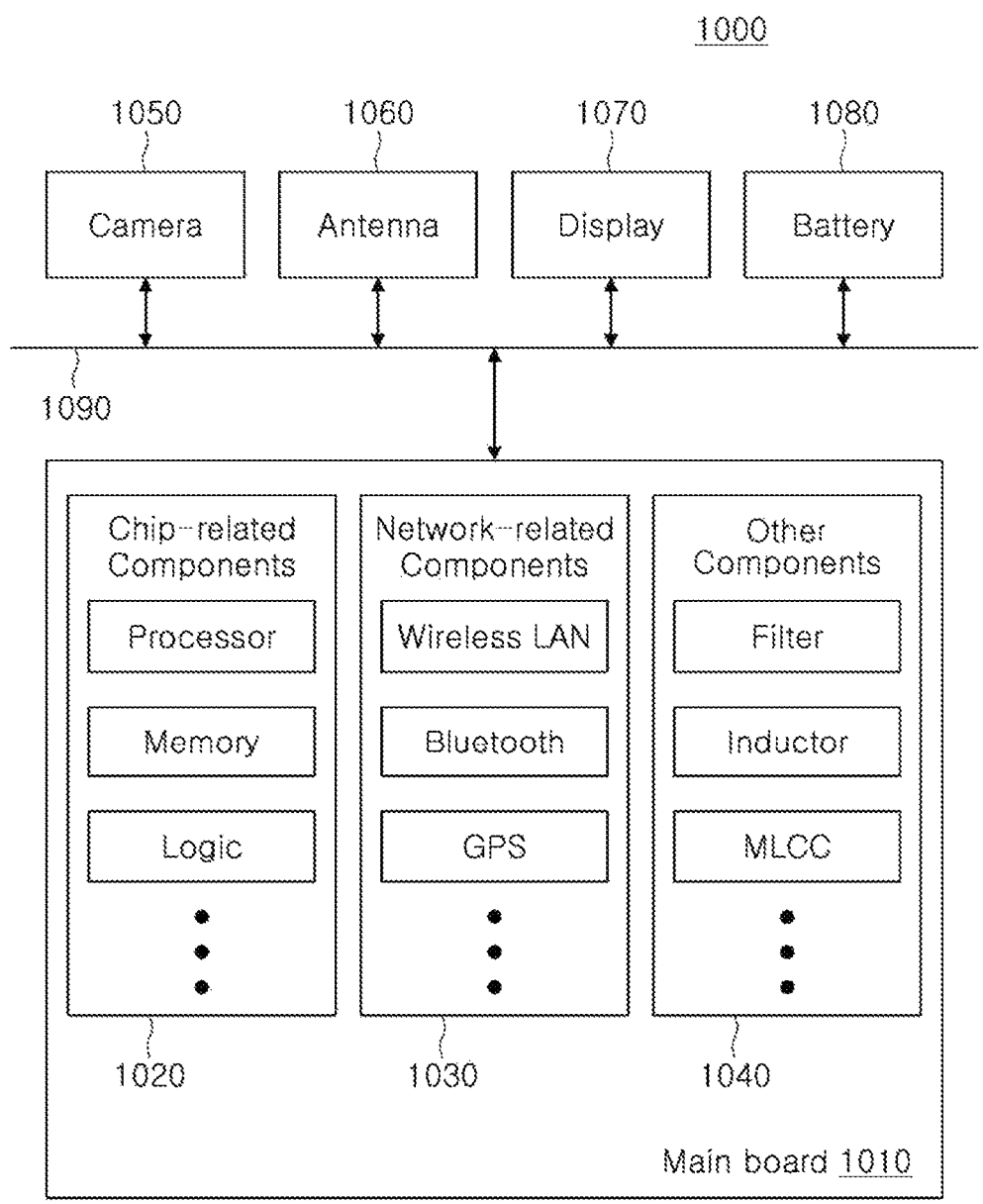
FIG. 1 is a schematic view illustrating an example of a block diagram of an electronic device system according to an example.

Hereinafter, embodiments of the present disclosure will be described with reference to the accompanying drawings. In the drawings, shapes, sizes, and the like, of elements may be exaggerated or briefly illustrated for clarity of description.

Electronic Device

FIG. 1 is a schematic view illustrating an example of a block diagram of an electronic device system according to an example.

Referring to FIG. 1, an electronic device 1000 may accommodate a mainboard 1010 therein. The mainboard 1010 may include chip related components 1020, network related components 1030, other components 1040, and the like, physically or electrically connected thereto. These components may be connected to others to be described below to form various signal lines 1090.

The chip related components 1020 may include a memory chip such as a volatile memory (for example, a dynamic random access memory (DRAM)), a non-volatile memory (for example, a read only memory (ROM)), a flash memory, or the like; an application processor chip such as a central processor (for example, a central processing unit (CPU)), a graphics processor (for example, a graphics processing unit (GPU)), a digital signal processor, a cryptographic processor, a microprocessor, a microcontroller, or the like; and a logic chip such as an analog-to-digital (ADC) converter, an application-specific integrated circuit (ASIC), or the like. However, the chip related components 1020 are not limited thereto, but may also include other types of chip related components. In addition, the chip related components 1020 may be combined with each other.

The network related components 1030 may include protocols such as wireless fidelity (Wi-Fi) (Institute of Electrical And Electronics Engineers (IEEE) 802.11 family, or the like), worldwide interoperability for microwave access (WiMAX) (IEEE 802.16 family, or the like), IEEE 802.20, long term evolution (LTE), evolution data only (Ev-DO), high speed packet access+ (HSPA+), high speed downlink packet access+ (HSDPA+), high speed uplink packet access+ (HSUPA+), enhanced data GSM environment (EDGE), global package for mobile communications (GSM), global positioning package (GPS), general packet radio service (GPRS), code division multiple access (CDMA), time division multiple access (TDMA), digital enhanced cordless telecommunications (DECT), Bluetooth, 3G, 4G, and 5G protocols, and any other wireless and wired protocols, designated after the abovementioned protocols. However, the network related components 1030 are not limited thereto, but may also include a variety of other wireless or wired standards or protocols. In addition, the network related components 1030 may be combined with each other, together with the chip related components 1020 described above.

Other components 1040 may include a high frequency inductor, a ferrite inductor, a power inductor, ferrite beads, a low temperature co-fired ceramic (LTCC), an electromagnetic interference (EMI) filter, a multilayer ceramic capacitor (MLCC), or the like. However, other components 1040 are not limited thereto, but may also include passive components used for various other purposes, or the like. In addition, other components 1040 may be combined with each other, together with the chip related components 1020 or the network related components 1030 described above.

Depending on a type of the electronic device 1000, the electronic device 1000 may include other components that may or may not be physically or electrically connected to the mainboard 1010. These other components may include, for example, a camera module 1050, an antenna 1060, a display device 1070, a battery 1080, an audio codec (not illustrated), a video codec (not illustrated), a power amplifier (not illustrated), a compass (not illustrated), an accelerometer (not illustrated), a gyroscope (not illustrated), a speaker (not illustrated), a mass storage unit (for example, a hard disk drive) (not illustrated), a compact disk (CD) drive (not illustrated), a digital versatile disk (DVD) drive (not illustrated), or the like. However, these other components are not limited thereto, but may also include other components used for various purposes depending on a type of electronic device 1000, or the like.

The electronic device 1000 may be a smartphone, a personal digital assistant (PDA), a digital video camera, a digital still camera, a network package, a computer, a monitor, a tablet PC, a laptop PC, a netbook PC, a television, a video game machine, a smartwatch, an automotive component, or the like. However, the electronic device 1000 is not limited thereto, but may be any other electronic device processing data.

Figure 2:
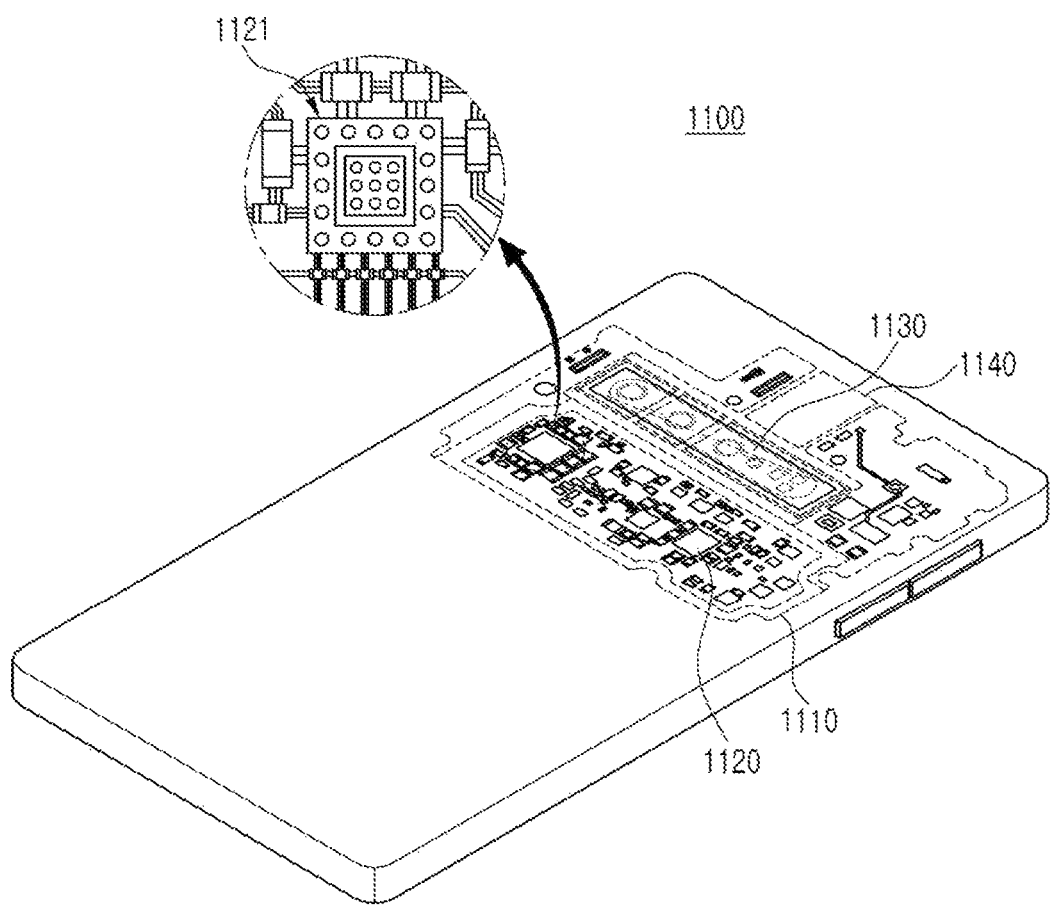
FIG. 2 is a schematic perspective view illustrating an electronic device according to an example.

FIG. 2 is a schematic perspective diagram illustrating an example of an electronic device.

Referring to FIG. 2, an electronic device may be, for example, a smartphone 1100. A mainboard 1110 may be accommodated in the smartphone 1100, and various electronic components 1120 may be physically and/or electrically connected to the mainboard 1110. In addition, other components that may or may not be physically or electrically connected to the printed circuit board 1110, such as a camera module 1130 and/or a speaker 1140, may be accommodated in the mainboard 1110. A portion of the electronic components 1120 may be chip related components, for example, a semiconductor package 1121, but are not limited thereto. The semiconductor package 1121 may be a surface mounted type, such as a semiconductor chip or a passive component on a package board of a multilayer printed circuit board, but is not limited thereto. Meanwhile, the electronic device is not necessarily limited to the smartphone 1100, but may be other electronic devices as described above.

Substrate-Embedded Electronic Component

Figure 3:
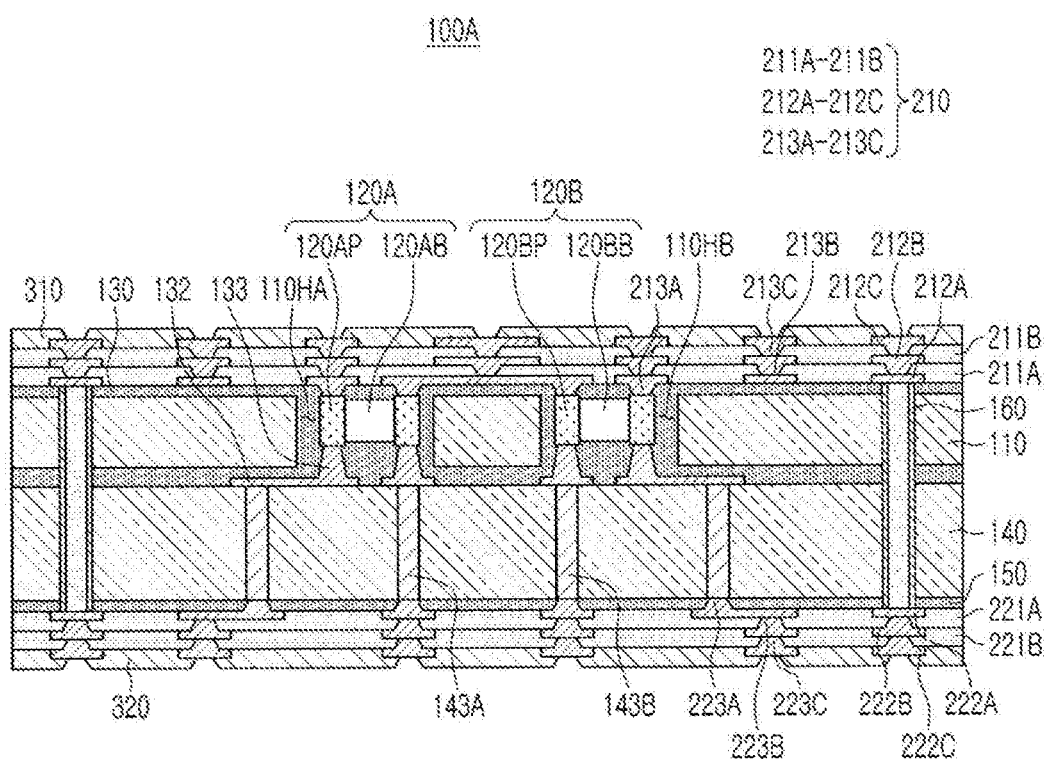
FIG. 3 is a schematic cross-sectional view of a substrate-embedded electronic component according to an example.

FIG. 3 is a schematic cross-sectional view of a substrate-embedded electronic component 100A according to an example.

Referring to FIG. 3, a substrate-embedded electronic component 100A according to an example may include a first core layer 110, a first through-portion 110HA and a second through-portion 110HB formed in the first core layer 110, a first electronic component 120A and a second electronic component 120B respectively disposed in the first through-portion 110HA and the second through-portion 110HB, an encapsulant 130 covering at least a portion of each of the first electronic component 120A and the second electronic component 120B, and filling at least a portion of each of the first through-portion 110HA and the second through-portion 110HB, a conductive via 133 penetrating at least a portion of the first encapsulant 130, and connected to each of the first electronic component 120A and the second electronic component 120B, a conductive pattern 132 buried in the first encapsulant 130 and connected to the conductive via 133, a second core layer 140 disposed on the encapsulant 130, a first through-via 143A penetrating the second core layer 140 and connected to the first electronic component 120A, a second through-via 143B penetrating the second core layer 140 and connected to the second electronic component 120B, an insulating layer 150 disposed on the second core layer 140, a third through-via 160 penetrating the first core layer 110, the encapsulant 130, the second core layer 140, and the insulating layer 150, a first build-up layer 210 disposed on the first core layer 110, and including one or more metal layers 212A to 212C connected to each of the first electronic component 120A, the second electronic component 120B, and the third through-via 160, a second build-up layer 220 disposed on the second core layer 140, and including one or more metal layers 222A to 222C connected to each of the first through-via 143A, the second through-via 143B, and the third through-via 160, a first passivation layer 310 disposed on the first build-up layer 210, and a second passivation layer 320 disposed on the second build-up layer 220.

In the case of a substrate-embedded electronic component, a problem such as shortening a life and deterioration of performance of an electronic component due to heat generation of the embedded electronic component may occur. When a portion of an internal region of the substrate-embedded electronic component is utilized as a heat dissipation structure, it is possible to provide a substrate-embedded electronic component having improved heat dissipation performance while maintaining an overall size of the substrate.

In the case of a substrate-embedded electronic component 100A according to an example, each of the first electronic component 120A and the second electronic component 120B respectively disposed in the first through-portion 110HA and the second through-portion 110HB of the first core layer 110 may be connected to through-vias 143A and 143B penetrating the second core layer 140 through the conductive pattern 132.

In particular, in the case of the substrate-embedded electronic component 100A according to an example, each of the first through-via 143A and the second through-via 143B may be connected to respective electrode pads 120AP and 120BP of the first electronic component 120A and the second electronic component 120B. However, the present disclosure is not limited thereto, and may be modified as substrate-embedded electronic components 100B to 100D according to another example.

The insulating layer 150 and the second build-up layer 220 may be further disposed on the second core layer 140. In this case, each of the first through-via 143A and the second through-via 143B may be connected to metal vias 223A to 223C and metal layers 222A to 222C of the second build-up layer 220.

Accordingly, heat generated in each of the first electronic component 120A and the second electronic component 120B may be emitted to an outside of the substrate through the conductive via 133, the conductive pattern 132, the first through-via 143A or the second through-via 143B, the metal vias 223A to 223C, and the metal layers 222A to 222C. Therefore, a problem such as shortening a lifespan and deterioration of performance of the electronic component due to heat generation of the embedded electronic component may be improved.

In addition, when it is required to provide a substrate-embedded electronic component having a core layer having a predetermined thickness or more, a portion of the core layer 140 region, which is a portion of the core layer, may be utilized as a region for heat dissipation. Therefore, a substrate-embedded electronic component having improved heat dissipation performance while maintaining an overall size of the substrate may be provided.

Hereinafter, each configuration of the substrate-embedded electronic component 100A according to an example will be described in more detail.

A material of the first core layer 110 is not particularly limited, and any material may be used as long as it has insulating properties. For example, a thermosetting resin such as an epoxy resin, a thermoplastic resin such as a polyimide, or a resin in which these resins are impregnated with a core such as glass cloth or glass fabric together with an inorganic filler, for example, a prepreg, Ajinomoto Build-up Film (ABF), FR-4, Bismaleimide Triazine (BT), and the like can be used. If necessary, a Photoimagable Dielectric (PID) resin may be used. A thickness of the first core layer 110 may be greater than a thickness of the insulating layer 150 and a thickness of each of the first build-up layer 210 and the second build-up layer 220.

Each of the first through-portion 110HA and the second through-portion 110HB may penetrate at least a portion of the first core layer 110. Although a case in which the first through-portion 110HA and the second through-portion 110HB have two through-portions are shown in the drawings, the number of through-portions may be smaller or larger than the number shown in the drawings. For example, the first core layer 110 may have only the first through-portion 110HA, or may further have a third through-portion. However, it is not limited thereto.

Each of the first electronic component 120A and the second electronic component 120B may be a passive component such as a multilayer ceramic capacitor (MLCC), a power inductor (PI), or the like, and an active component such as an integrated circuit (IC) and a die.

The first electronic component 120A and the second electronic component 120B may respectively include bodies 120AB and 120BB. In addition, the first electronic component 120A and the second electronic component 120b may respectively include electrode pads 120AP and 120BP. Therefore, the first through-via 143A and the second through-via 143B may be connected to the bodies 120AB and 120BB and/or the electrode pads 120AP and 120BP of each of the first electronic component 120A and the second electronic component 120B, respectively.

In the drawings, two electronic components, which are the first electronic component 120A and the second electronic component 120B, are illustrated as being disposed, but the number of embedded electronic components may be smaller or larger than that shown in the drawings. In addition, although one electronic component is illustrated as being disposed in each of the fist through-portion 110HA and the second through-portion 110HB, the number of electronic components disposed in one through-portion may be larger or smaller than the number shown in the drawings. For example, a third electronic component may be further disposed in the first through-portion 110HA. However, it is not limited thereto.

A material of the encapsulant 130 is not particularly limited, and any material can be used, as long as it has insulating properties. For example, a thermosetting resin such as an epoxy resin, a thermoplastic resin such as a polyimide, or a resin in which these resins are impregnated with a core such as glass cloth or glass fabric together with an inorganic filler, for example, a prepreg, Ajinomoto Build-up Film (ABF), FR-4, Bismaleimide Triazine (BT), and the like, can be used. If necessary, a Photo Imageable Dielectric (PID) resin may be used.

As a formation material of the conductive via 133, a conductive material such as copper (Cu), aluminum (Al), silver (Ag), tin (Sn), gold (Au), nickel (Ni), lead (Pb), titanium (Ti), or alloys thereof may be used. The via 143 may be entirely filled with a conductive material, or the conductive material may be formed along a wall of a via. In addition, the shape of the via 143 may be any shape known in the art, such as a tapered shape, a cylindrical shape, and the like.

As a formation material of the conductive pattern 132, a conductive material such as copper (Cu), aluminum (Al), silver (Ag), tin (Sn), gold (Au), nickel (Ni), lead (Pb), titanium (Ti), or alloys thereof may be used.

The conductive via 133 and the conductive pattern 132 may be connected to the first through-via 143A and the second through-via 143B. Therefore, heat generated in the first electronic component 120A and the second electronic component 120B may be emitted to an outside of the substrate-embedded electronic component through the first through-via 143A or the second through-via 143B via the conductive via 133 and the conductive pattern 132, respectively.

A material of the second core layer 140 is not particularly limited, and any material can be used as long as it has insulating properties. For example, a thermosetting resin such as an epoxy resin, a thermoplastic resin such as a polyimide, or a resin in which these resins are impregnated with a core such as glass cloth or glass fabric together with an inorganic filler, for example, a prepreg, Ajinomoto Build-up Film (ABF), FR-4, Bismaleimide Triazine (BT), and the like can be used. If necessary, a Photo Imageable Dielectric (PID) resin may be used. A thickness of the second core layer 140 may be greater than a thickness of the insulating layer 150 and a thickness of each of the first build-up layer 210 and the second build-up layer 220.

As a formation material of each of the first through-via 143A and the second through-via 143B, a conductive material such as copper (Cu), aluminum (Al), silver (Ag), tin (Sn), gold (Au), nickel (Ni), lead (Pb), titanium (Ti), or alloys thereof may be used. Each of the first through-via 143A and the second through-via 143B may be entirely filled with a conductive material, or the conductive material may be formed along a wall of a via. When each of the first through-via 143A and the second through-via 143B is formed as a conductive material is formed along the wall of the via, an inside of the wall of the via may be filed with an insulating material (not shown), or the like. In addition, the shapes of each of the first through-via 143A and the second through-via 143B may be all shapes known in the art, such as a tapered shape, a cylindrical shape, and the like.

The first through-via 143A and the second through-via 143B may penetrate the second core layer 140, and connect the conductive pattern 132 and the first to third metal layers 222A to 222C of the second build-up layer 220. Accordingly, heat generated in the first electronic component 120A and the second electronic component 120*b* may be emitted to an outside of the substrate-embedded electronic component through the conductive via 133, the conductive pattern 132, the first through-via 143A or the second through-via 143B, and the first to third metal layers 222A to 222C of the second build-up layer 220.

A material of the insulating layer 150 is not particularly limited, and any material can be used as long as it has insulating properties. For example, a thermosetting resin such as an epoxy resin, a thermoplastic resin such as a polyimide, or a resin in which these resins are impregnated with a core such as glass cloth or glass fabric together with an inorganic filler, for example, a prepreg, Ajinomoto Build-up Film (ABF), FR-4, Bismaleimide Triazine (BT), and the like can be used. If necessary, a Photoimagable Dielectric (PID) resin may be used.

As a formation material of the third through-via 160, a conductive material such as copper (Cu), aluminum (Al), silver (Ag), tin (Sn), gold (Au), nickel (Ni), lead (Pb), titanium (Ti), or alloys thereof may be used. The through-via 160 may be entirely filled with a conductive material, or the conductive material may be formed along a wall of a via. As shown in the drawing, when the through-via 160 is formed along the wall of the via, an inside of the wall of the via may be filled with an insulating material (not shown), or the like. In addition, the shape of the through-via 160 may have all shapes in the art, such a tapered shape, a cylindrical shape, and the like.

The through-via 160 may penetrate the first core layer 110, the encapsulant 130, the second core layer 140, and the insulating layer 150, and may connect the first to third metal layers 212A to 212C of the first build-up layer 210 and the first to third metal layers 222A to 222C of the second build-up layer 220 to each other.

The first build-up layer 210 may include a first metal layer 212A disposed on the encapsulant 130, a first metal via 213A penetrating a portion of the encapsulant 130 and connecting the electronic components 120A and 120B and the first metal layer 212A, a first insulating layer 211A disposed on the encapsulant 130 and covering the first metal layer 212A, a second metal layer 212B disposed on the first insulating layer 211A, a second metal via 213B penetrating a portion of the first insulating layer 211A and connecting the first metal layer 212A and the second metal layer 212B, a second insulating layer 211B disposed on the first insulating layer 211A and covering the second metal layer 212B, a third metal layer 212C disposed on the second insulating layer 211B, and a third metal via 213C penetrating a portion of the second insulating layer 211B and connecting the second metal layer 212B and the third metal layer 212C.

However, the present disclosure is not limited thereto, and may be changed as much as possible in a range within the creative ability of those skilled in the art. That is, the number of insulating layers, metal layers, and metal vias included in the first build-up layer 210 may be larger or smaller than that shown in the drawings.

A material of each of the first to second insulating layers 211A to 211B is not particularly limited, and any material may be used as long as it has insulating properties. For example, a thermosetting resin such as an epoxy resin, a thermoplastic resin such as a polyimide, or a resin in which these resins are impregnated with a core such as glass cloth or glass fabric together with an inorganic filler, for example, a prepreg, Ajinomoto Build-up Film (ABF), FR-4, Bismaleimide Triazine (BT), and the like can be used. If necessary, a Photoimagable Dielectric (PID) resin may be used.

A boundary between the first to second insulating layers 211A to 211B may not be distinguished according to materials, processes, or the like of each of the insulating layers. That is, during a lamination process, the first to second insulating layers 211A to 211B may be integrated with each other, or a boundary surface therebetween may be unclear, such that it may be difficult to visually determine a boundary therebetween in a structure of the completed substrate-embedded electronic component.

As a formation material of the first to third metal layers 212A to 212C, a conductive material such as copper (Cu), aluminum (Al), silver (Ag), tin (Sn), gold (Au), nickel (Ni), lead (Pb), titanium (Ti), or alloys thereof may be used. The first to third metal layers 212A to 212C may perform various functions depending on designs. Each of the first to third metal layers 212A to 212C may perform various functions depending on designs. For example, each of the first to third metal layers 212A to 212C may include a ground (GND) pattern, a power (PWR) pattern, a signal (S) pattern, and the like. Here, the signal (S) pattern may include various signals except for the ground (GND) pattern, the power (PWR) pattern, and the like, such as data signals, and the like. In addition, via pads, connection terminal pads, and the like may be included.

As a formation material of the first to third metal vias 213A to 213C, a conductive material such as copper (Cu), aluminum (Al), silver (Ag), tin (Sn), gold (Au), nickel (Ni), lead (Pb), titanium (Ti), or alloys thereof may be used. Each of the first to third metal vias 213A to 213C may be entirely filled with a conductive material, or the conductive material may be formed along a wall of a via. In addition, shapes of the first to third metal vias 213A to 213C may be all shapes known in the art, such as a tapered shape, a cylindrical shape, and the like.

The second build-up layer 220 may include a first metal layer 222A disposed on the insulating layer 150, a first metal via 223A penetrating the insulating layer 150 and connecting the first and second through-vias 143A, 143B to the first metal layer 222A, a first insulating layer 221A disposed on the insulating layer 150 and covering the first metal layer 222A, a second metal layer 222B disposed on the first insulating layer 221A, a second metal via 223B penetrating a portion of the first insulating layer 221A and connecting the first metal layer 222A and the second metal layer 222B, a second insulating layer 221B disposed on the first insulating layer 221A and covering the second metal layer 222B, a third metal layer 222C disposed on the second insulating layer 221B, and a third metal via 223C penetrating a portion of the second insulating layer 221B and connecting the second metal layer 222B and the third metal layer 222C.

However, the present disclosure is not limited thereto, and may be changed as much as possible within a range that can be implemented by those skilled in the art. That is, the number of insulating layers, metal layers, and metal vias included in the second build-up layer 220 may be larger or smaller than that shown in the drawings.

A material of each of the first to second insulating layers 221A to 221B is not particularly limited, and any material may be used as long as it has insulating properties. For example, a thermosetting resin such as an epoxy resin, a thermoplastic resin such as a polyimide, or a resin in which these resins are impregnated with a core such as glass cloth or glass fabric together with an inorganic filler, for example, a prepreg, Ajinomoto Build-up Film (ABF), FR-4, Bismaleimide Triazine (BT), and the like can be used. If necessary, a Photoimagable Dielectric (PID) resin may be used.

A boundary between the first to second insulating layers 221A to 221B may not be distinguished according to materials, processes, or the like of each of the insulating layers. That is, during a lamination process, the first to second insulating layers 221A to 221B may be integrated with each other, or a boundary surface therebetween may be unclear, such that it may be difficult to visually determine a boundary therebetween in a structure of the completed substrate-embedded electronic component with the naked eye.

As a formation material of the first to third metal layers 222A to 222C, a conductive material such as copper (Cu), aluminum (Al), silver (Ag), tin (Sn), gold (Au), nickel (Ni), lead (Pb), titanium (Ti), or alloys thereof may be used. The first to third metal layers 212A to 212C may perform various functions depending on design. For example, each of the first to third metal layers 222A to 222C may include a ground (GND) pattern, a power (PWR) pattern, a signal (S) pattern, and the like. Here, the signal(S) pattern may include various signals except for the ground (GND) pattern, the power (PWR) pattern, and the like, such as data signals, and the like. In addition, via pads, connection terminal pads, and the like may be included.

In particular, the first to third metal layers 222A to 222C may include a metal pattern connected to the first and second through-vias 143A and 143B. Therefore, as described above, heat generated in the first electronic component 120A and the second electronic component 120B may be emitted to an outside of the substrate through the conductive via 133, the conductive pattern 132, the through-vias 143A and 143B, and the metal vias 223A to 223C, and the metal layers 222A to 222C.

As a formation material of the first to third metal vias 223A to 223C, a conductive material such as copper (Cu), aluminum (Al), silver (Ag), tin (Sn), gold (Au), nickel (Ni), lead (Pb), titanium (Ti), or alloys thereof may be used. The first to third metal layers 212A to 212C may perform various functions depending on designs. Each of the first to third metal vias 223A to 223C may be entirely filled with a conductive material, or the conductive material may be formed along a wall of a via. In addition, the shapes of each of the first to third metal vias 223A to 223C may be all shapes known in the art, such as a tapered shape, a cylindrical shape, and the like.

A first passivation 310 is an additional configuration for protecting the first build-up layer 210 from external physical and/or chemical damages, or the like. The first passivation layer 310 may have an opening for exposing at least a portion of the metal layer 212C of the first build-up layer 210. A material of the first passivation layer 310 is not particularly limited. For example, a photosensitive insulating material such as a photosensitive insulating resin or a solder resist may be used, but is not limited thereto.

A second passivation layer 320 is an additional configuration for protecting the second build-up layer 220 from external physical and/or chemical damages, or the like. The second passivation layer 320 may have an opening for exposing at least a portion of the metal layer 222C of the second build-up layer 220. A material of the second passivation layer 320 is not particularly limited. For example, a photosensitive insulating material such as a photosensitive insulating resin or a solder resist may be used, but is not limited thereto.

Figure 4:
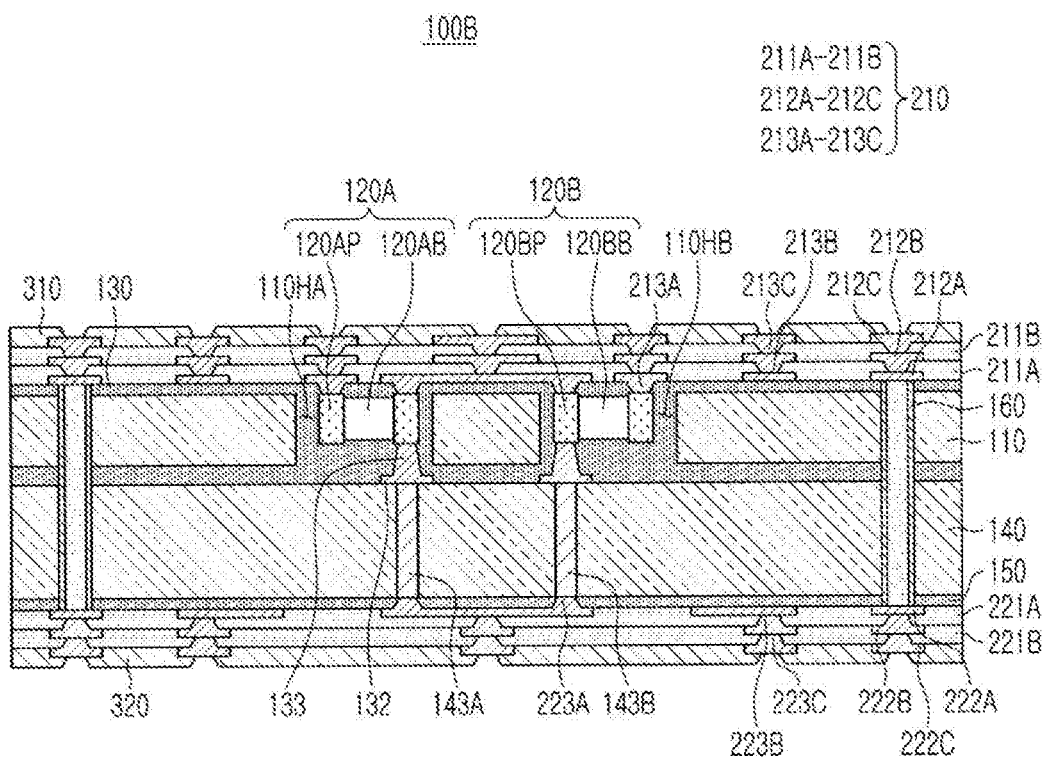
FIG. 4 is a schematic cross-sectional view of a substrate-embedded electronic component according to another example.

FIG. 4 is a schematic cross-sectional view illustrating a substrate-embedded electronic component 100B according to another example.

Referring to FIG. 4, the substrate-embedded electronic component 100B according to another example may include a metal pattern in which at least one metal layer among the first to third metal layers 222A to 222C of the second build-up layer 220 connects the first through-via 143A and the second through-via 143B in the substrate-embedded electronic component 110A according to the example. For example, as illustrated in the drawing, the first metal layer 222A may include a metal pattern connecting the first through-via 143A and the second through-via 143B, but is not limited thereto.

Other contents are substantially the same as described in the substrate-embedded electronic component 100A according to an example, such that detailed descriptions thereof will be omitted.

Figure 5:
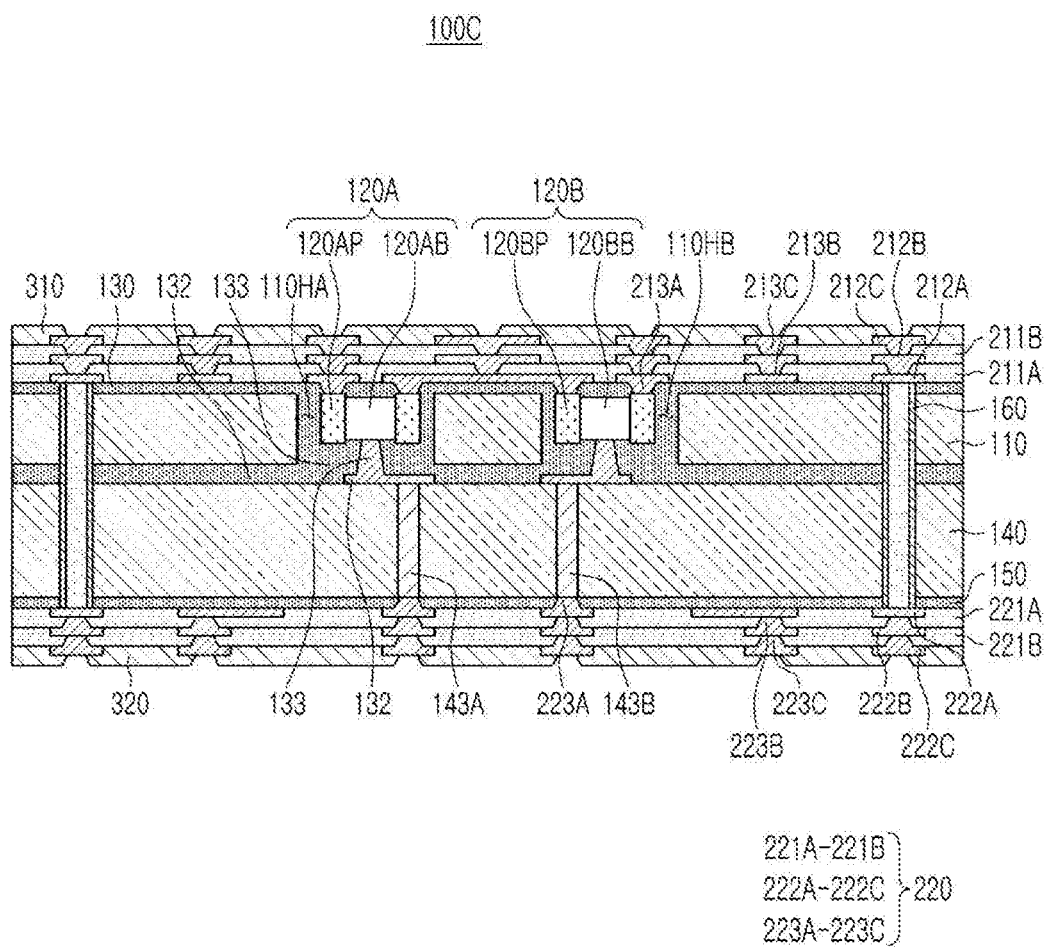
FIG. 5 is a schematic cross-sectional view of a substrate-embedded electronic component according to another example.

FIG. 5 is a schematic cross-sectional view illustrating a substrate-embedded electronic component 100C according to another example.

Referring to FIG. 5, in the substrate-embedded electronic component 100C according to another example, the first through-via 143A and the second through-via 143B may be respectively connected to bodies 120AB and 120BB of the first electronic component 120A and the second electronic component 120B, in the substrate-embedded electronic component 100A according to the example described above.

Other contents are substantially the same as described in the substrate-embedded electronic component 100A according to an example, such that detailed descriptions thereof will be omitted.

Figure 6:
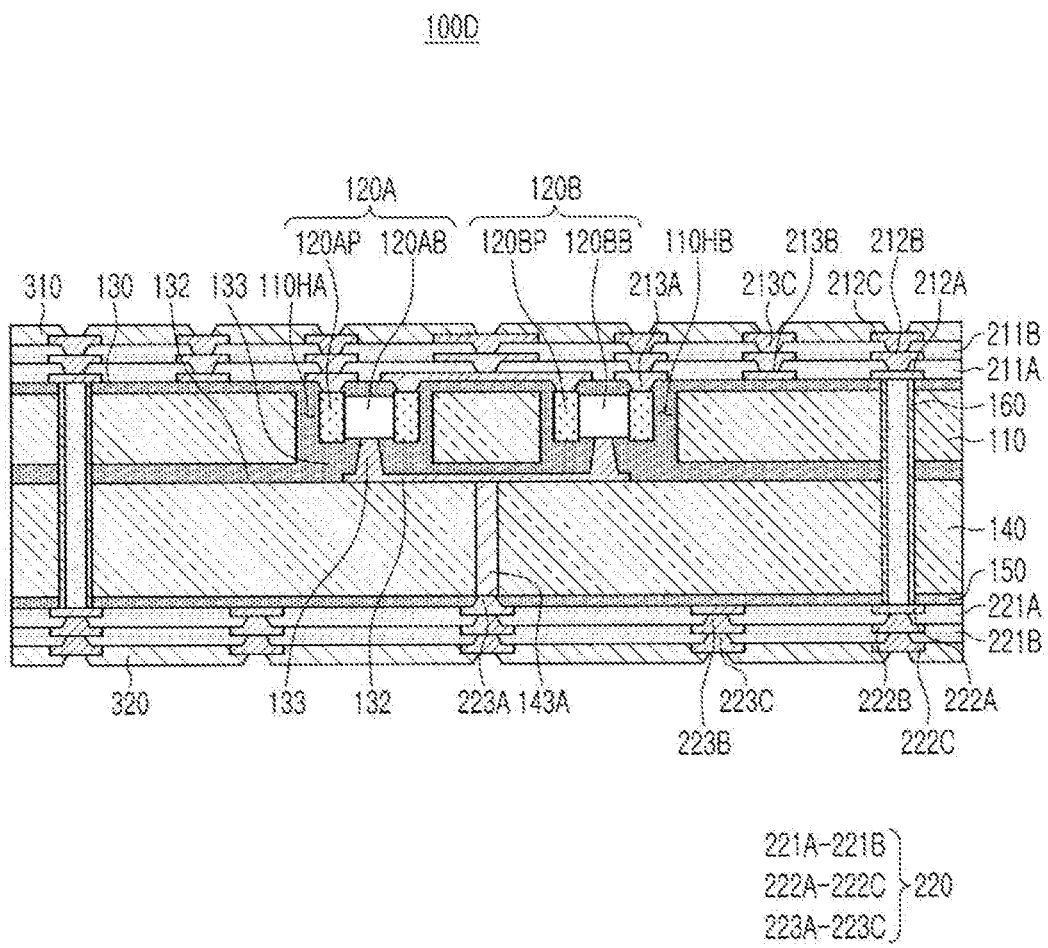
FIG. 6 is a schematic cross-sectional view of a substrate-embedded electronic component according to another example.

FIG. 6 is a schematic cross-sectional view illustrating a substrate-embedded electronic component 100D according to another example.

Referring to FIG. 6, in the substrate-embedded electronic component 100C according to another example, the first through-via 143A may be connected to respective bodies 120AB and 120BB of the first electronic component 120A and the second electronic component 120B, in the substrate-embedded electronic component 100A according to the example described above. Therefore, heat generated in the plurality of electronic components 120A and 120B may be emitted to an outside of the substrate through one through-via 143A.

FIGS. 7A to 9E are views illustrating a portion of a manufacturing process of the substrate-embedded electronic component 100A according to an example.

Figure 7A:
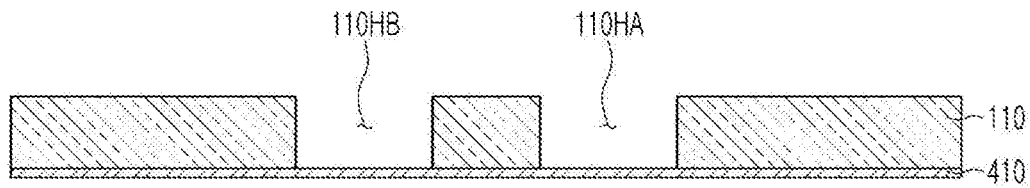
FIGS. 7A to 9E are schematic views illustrating a portion of a manufacturing process of the substrate-embedded electronic component according to an example.

Referring to FIG. 7A, a first through-portion 110HA penetrating the first core layer 110 and a second through-portion 110HB are formed, respectively, and then an adhesive film 410 is attached to one side of the first core layer 110.

Formation of each of the first through-portion 110HA and the second through-portion 110HB may be performed by a sandblasting method using abrasive particles, a dry etching method using plasma, or the like. However, the present disclosure is not limited thereto, and each of the first through-portion 110HA and the second through-portion 110HB may be formed by using a mechanical drill, a laser drill, or the like. When the first through-portion 110HA and the second through-portion 110HB are formed using the mechanical drill, the laser drill, a desmearing treatment such as a permanganate method, or the like may be performed to remove a resin smear in the first through-portion 110HA and the second through-portion 110HB.

The adhesive film 410 may be used as long as the first core layer 110 may be fixed, and a known tape, or the like may be used as a non-limiting example. As an example of the known tape may be a heat-treatment curable adhesive tape having a weakened adhesive force by a heat treatment, ultraviolet curable adhesive tape having weakened adhesive force by ultraviolet irradiation, or the like.

Figure 7B:
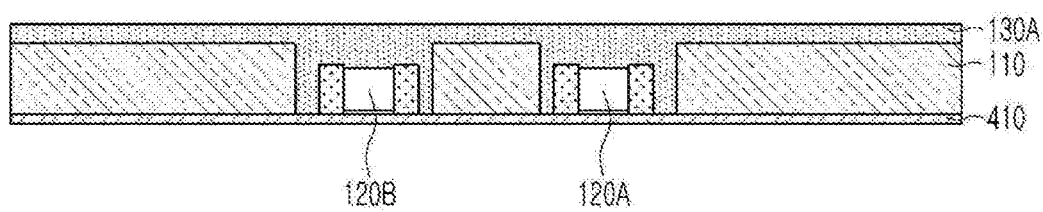

Referring to FIG. 7B, the first electronic component 120A and the second electronic component 120B may be disposed in each of the first through-portion 110HA and the second through-portion 110HB, and then the first electronic component 120A and the second electronic component 120B may be encapsulated using an encapsulant 130A.

The first electronic component 120A and the second electronic component 120B may be disposed such that the first electronic component 120A and the second electronic component 120B are attached on the adhesive film 410 in each of the first through-portion 110HA and the second through-portion 110HB, respectively. Accordingly, one surface of the first core layer 110 and one surface of each of the first electronic component 120A and the second electronic component 120B may be substantially located on the same plane. That is, one surface of the first core layer 110 and one surface of each of the first electronic component 120A and the second electronic component 120B may be coplanar. In this case, each of the first electronic component 120A and the second electronic component 120B may be disposed to be spaced apart from the first core layer 110 by a predetermined distance in each of the first through-portion 110HA and the second through-portion 110HB.

The encapsulant 130A may cover at least a portion of each of the first electronic component 120A and the second electronic component 120B, and may fill at least a portion of the space in each of the first through-portion 110HA and the second through-portion 110HB. The encapsulant 130A may be formed by a known method, and for example, the encapsulant 130A may be formed by laminating a precursor and then curing. Alternatively, the encapsulant 130A may be formed by applying the encapsulant 130A so as to encapsulate the first electronic component 120A and the second electronic component 120B on the adhesive film 410 and then cured to form the encapsulant 130A. The first electronic component 120A and the second electronic component 120B may be fixed by curing.

Figure 7C:
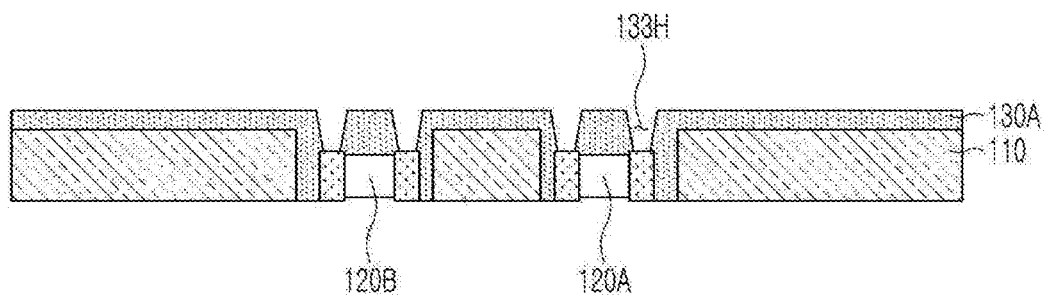

Referring to FIG. 7C, a via hole 133H penetrating a portion of the encapsulant 130A and exposing electrode pads 120AP and 120BP of each of the first electronic component 120A and the second electronic component 120B may be formed. In addition, the adhesive film 410 may be peeled off.

The via hole 133H may be formed using a photolithography method, a mechanical drill, a laser drill, or the like.

A peeling method of the adhesive film 410 is not particularly limited, and may be performed by a known method. For example, when a heat-treatment curable adhesive tape having a weakened adhesive force by a heat treatment, a ultraviolet curable adhesive tape having a weakened adhesive force by ultraviolet irradiation, and the like are used, it may be performed after the adhesive force is weakened by heat-treating the adhesive film 410, or after the adhesive force is weakened by irradiating ultraviolet rays to the adhesive film 410.

Figure 7D:
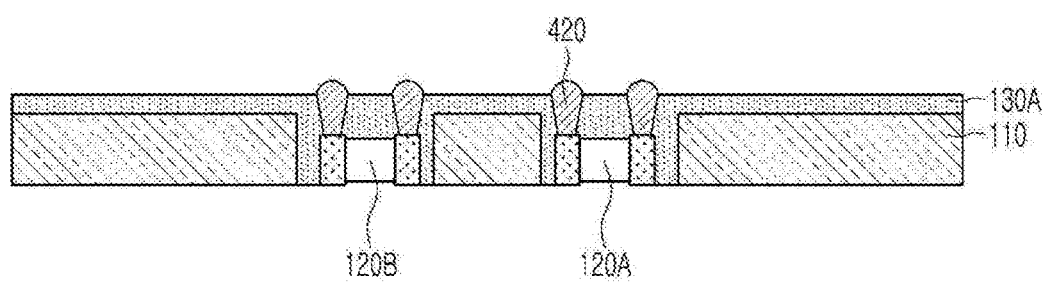

Referring to FIG. 7D, a conductive paste 420 may be disposed in the via hole 133H.

As the conductive paste 420, a conductive material such as copper (Cu), aluminum (Al), silver (Ag), tin (Sn), gold (Au), nickel (Ni), lead (Pb), titanium (Ti), or alloys thereof may be used. The conductive paste 420 may be disposed to protrude further than an upper surface of the via hole 133H. Therefore, as described later, the conductive paste may flow into a through-portion 130BH of a formed encapsulant 130B. The conductive paste 420 disposed in the via hole 133H may form the conductive via 133, and the conductive paste 420 disposed in the through-portion 130BH of the encapsulant 130B may form the conductive pattern 132.

Figure 8A:
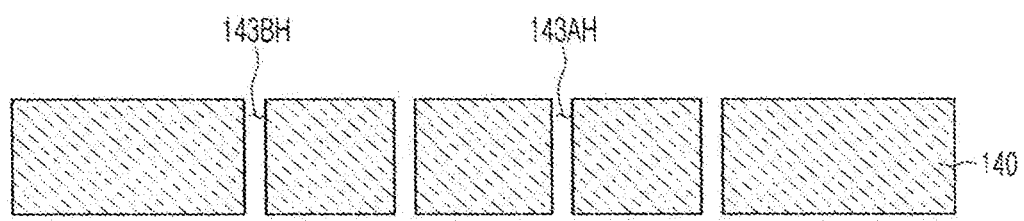

Referring to FIG. 8A, first a second core layer 140 may be prepared, and then a first through-portion 143AH and a second through-portion 143BH penetrating the second core layer 140 may be formed.

Each of the first through-portion 143AH and the second through-portion 143BH may be formed by a photolithography method, a mechanical drill, a laser drill, or the like. When the first through-portion 143AH and the second through-portion 143BH are formed by using a mechanical drill, a laser drill, desmearing treatment such as a permanganate method, or the like may be performed to remove a resin smear in the first through-portion 143AH and the second through-portion 143BH. However, the present disclosure is not limited thereto, and the first through-portion 143AH and the second through-portion 143BH may be performed by a sandblasting method using abrasive particles, a dry etching method using plasma, or the like, if necessary.

Figure 8B:
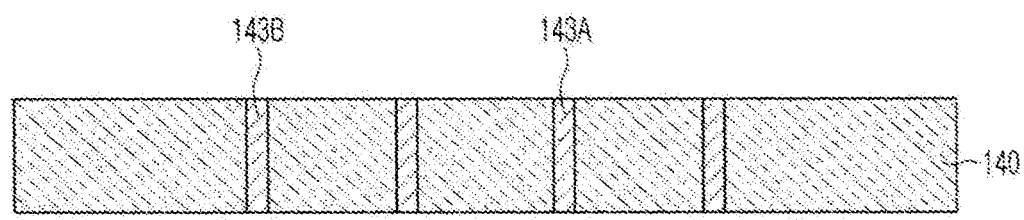

Referring to FIG. 8B, a plating process may be performed in each of the first through-portion 143AH and the second through-portion 143BH to form the first through-via 143A and the second through-via 143B. As the plating process, electroplating or electroless plating, specifically chemical vapor deposition (CVD), physical vapor deposition(PVD), sputtering, subtractive, additive, a semi-additive process (SAP), a modified semi-additive process (MSAP), or the like, may be used, but is not limited thereto.

Each of the first through-portion 143AH and the second through-portion 143BH may be entirely filled with a conductive material, or the conductive material may be formed along a walls of a via. When each of the first through-portion 143AH and the second through-portion 143BH is formed as a conductive material is formed along the wall of the via, an inside of the wall of the via may be filled with an insulating material (not shown).

Figure 9A:
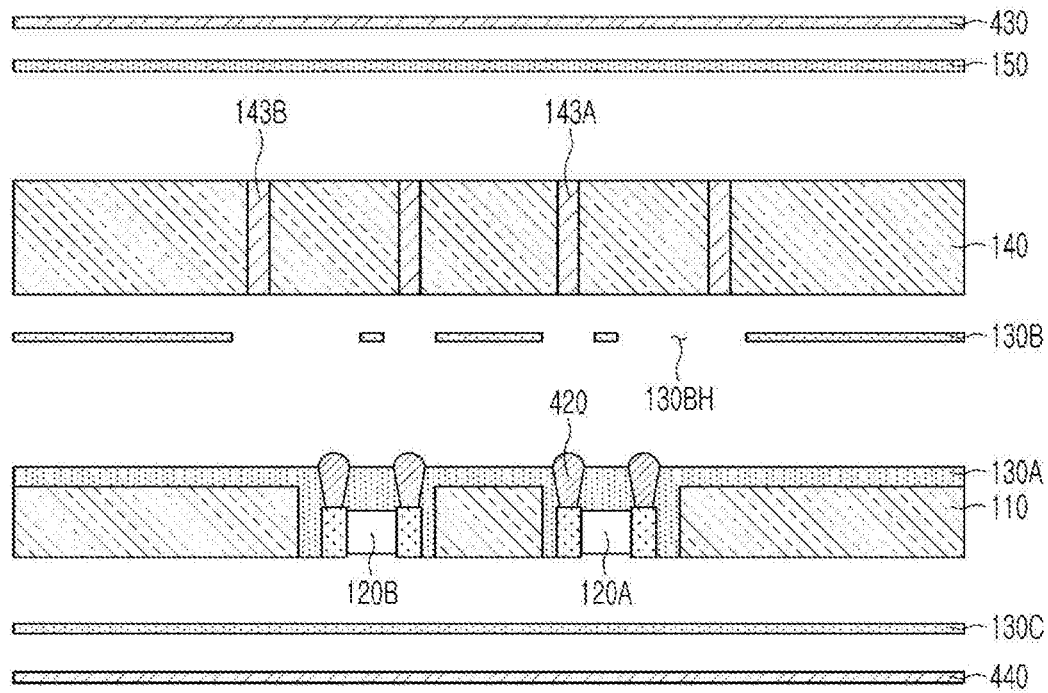
Figure 9B:
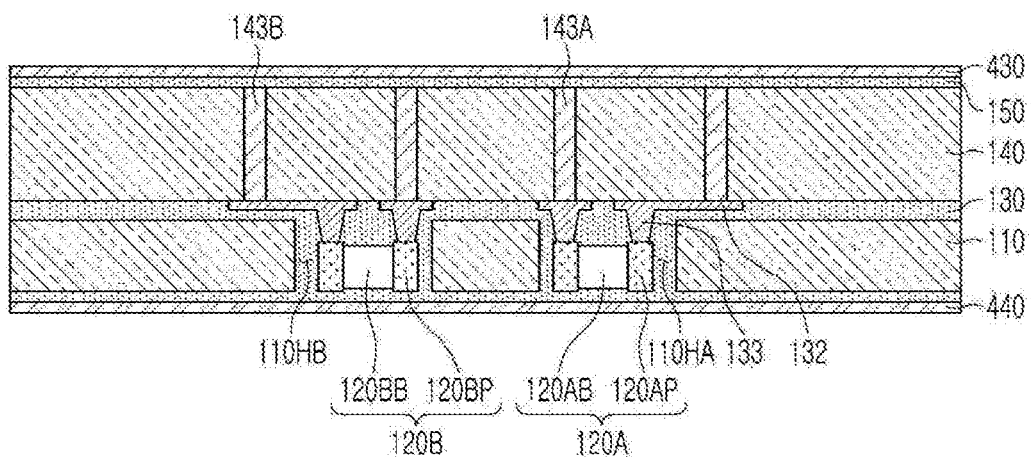

Referring to FIGS. 9A and 9B, a metal plate 440, an encapsulant 130C, a first core layer 110 formed through processes of FIGS. 7A to 7C, electronic components 120A and 120B, an encapsulant 130A, a structure including a conductive paste 420, an encapsulant 130B having a through-portion 130BH therein, a second core layer 140 formed through processes of FIGS. 8A to 8B, a structure including through-vias 143A and 143B, an insulating layer 150, and a metal plate 430 are sequentially stacked.

In this case, a formation material of the encapsulants 130A, 130B, and 130C and the insulating layer 150 may be in an uncured state or a semi-cured state. Therefore, a boundary between the encapsulants 130A, 130B, and 130C after lamination may not be distinguished according to materials, processes, and the like of each insulating layer. That is, a formation materials of the encapsulants 130A, 130B, and 130C may be integrated with each other during the lamination process or a boundary surface therebetween may be unclear, such that it may be difficult to visually determine a boundary therebetween with the naked eye in a structure of the completed substrate-embedded electronic component. For example, in FIG. 3, the encapsulants 130A, 130B, and 130C are illustrated as one encapsulant 130 that is integrated with each other and they have no a boundary surface. However, unlike shown in FIG. 3, the encapsulant 130 may include two or more layers separated from each other.

In addition, a conductive paste 420 may flow into a through-portion 130BH formed in the encapsulant 130B. Therefore, as shown in FIG. 9B, the conductive via 133 and the conductive pattern 132 may be formed. That is, the conductive paste 420 disposed in the via hole 133H may form the conductive via 133, and the conductive paste 420 disposed in the through-portion 130BH of the encapsulant 130B may form the conductive pattern 132. Thus, the conductive pattern 132 and the conductive via 132, made of the same material, may be as a conductive structure to connect the through-via 143A or 143B to the electronic component 120A or 120B.

Figure 9C:
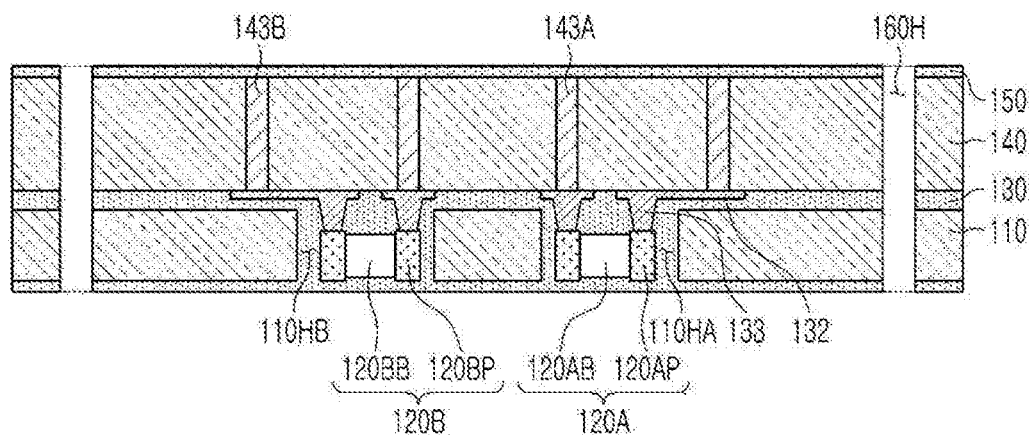

Referring to FIG. 9C, the metal plates 410 and 430 may be removed by a known etching method, or the like, to form a third through-portion 160H.

The third through-portion 160H may be formed by a photolithography method, a mechanical drill, a laser drill, or the like. When the third through-portion 160H is formed by using a mechanical drill and/or a laser drill, a desmearing treatment such as a permanganate method may be performed to remove a resin smear in the third through-portion 160H. However, the present disclosure is not limited thereto, and the formation of each of the third through-portions 160H may be performed by a sandblasting method using abrasive particles, a dry etching method using plasma, and the like, if necessary.

Figure 9D:
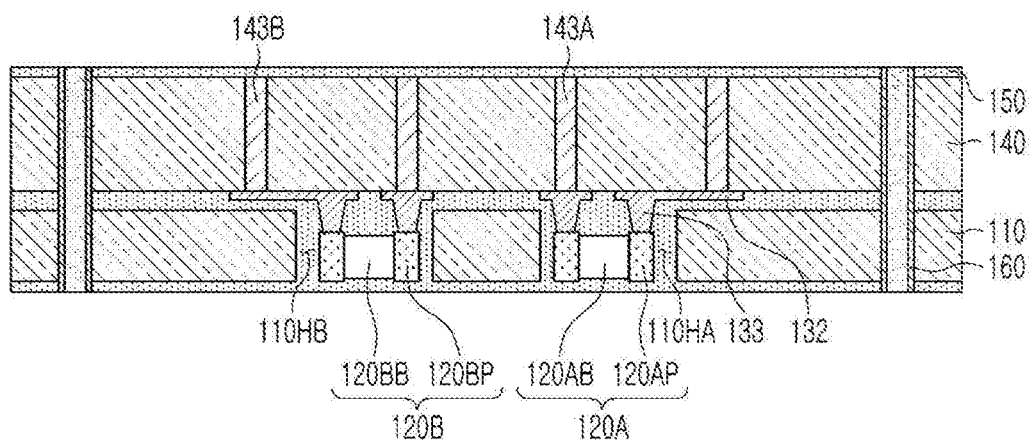

Referring to FIG. 9D, a plating process may be performed in the third through-portion 160H to form a third through-via 160.

As a plating process, electroplating or electroless plating, specifically chemical vapor deposition (CVD), physical vapor deposition (PVD), sputtering, subtractive, additive, a semi-additive process (SAP), a modified semi-additive process (MSAP), or the like may be used, but is not limited thereto.

A third through-portion 160H may be formed by being filled with a conductive material, or the conductive material may be formed along a wall of a via. When the third through-portion 160H is formed as a conductive material is formed along the wall of the via, an inside of the via may be filled with an insulating material (not shown).

Figure 9E:
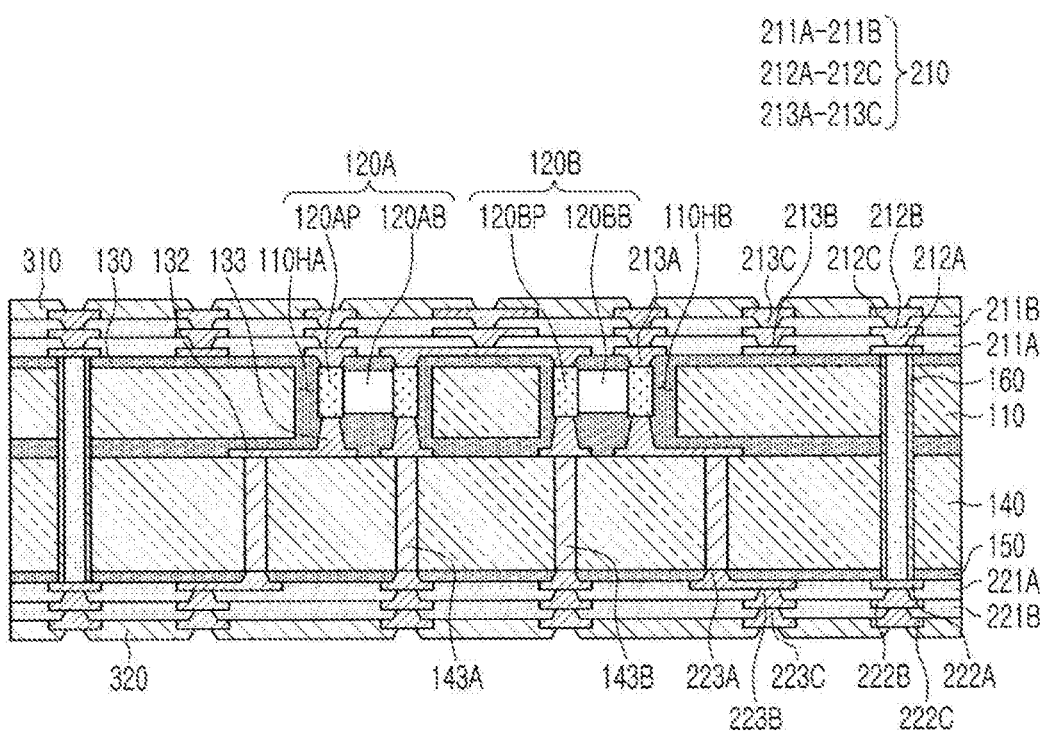

Referring to FIG. 9E, a first build-up layer 210 and a second build-up layer 220 may be formed on both surfaces of the substrate.

In the case of the first build-up layer 210, first a metal via 213A penetrating the encapsulant 130 may be formed. In addition, a first metal layer 212A may be formed on the encapsulant 130. Next, a first insulating layer 211A covering the first metal layer 212A may be formed on the encapsulant 130. Thereafter, a second metal via 213B penetrating the first insulating layer 211A may be formed. In addition, a second metal layer 212B may be formed on the first insulating layer 211A. Next, a second insulating layer 211B covering the second metal layer 212B may be formed on the first insulating layer 211. Thereafter, a third metal via 213C penetrating the second insulating layer 211B may be formed. In addition, a third metal layer 212C may be formed on the second insulating layer 211B.

The first to third metal vias 213A to 213C and the first to third metal layers 212A to 212C may form a via hole in the encapsulant 130 or in the first to second insulating layers 211A to 211B using a photolithography method, a mechanical drill, a laser drill, or the like, and then may be patterned by a dry film, or the like, and the via hole and the patterned space may be filled by a plating process, or the like.

The first to second insulating layers 211A to 211B may be formed by laminating a precursor by a known lamination method, and then curing the precursor, or by applying a precursor material by a known application method and then curing it.

In the case of the second build-up layer 220, a first metal via 223A penetrating the insulating layer 150 may be formed. In addition, a first metal layer 222A may be formed on the insulating layer. Next, a first insulating layer 221A covering the first metal layer 222A may be formed on the insulating layer 150. Thereafter, a second metal via 223B penetrating the first insulating layer 221A may be formed. In addition, a second metal layer 222B may be formed on the first insulating layer 221A. Next, a second insulating layer 221B covering the second metal layer 222B may be formed on the first insulating layer 221A. Thereafter, a third metal via 223C penetrating the second insulating layer 221B may be formed. In addition, a third metal layer 222C may be formed on the second insulating layer 221B. These formation methods are the same as the formation method of the first build-up layer 210.

If necessary, a first passivation layer 310 and a second passivation layer 320 may be formed on the first build-up layer 210 and the second build-up layer 220, respectively. Each of the first passivation layer 310 and the second passivation layer 320 may be formed by laminating precursors of each of the first passivation layer 310 and the second passivation layer 320 and then curing it, or by applying formation materials of each of the first passivation layer 310 and the second passivation layer 320 and then curing it. An opening (not labeled) may be formed so that at least a portion of the metal layers 212C and 223C of each of the first build-up layer 210 and the second build-up layer 220 are exposed in each of the first build-up layer 210 and the second build-up layer 220.

The manufacturing process of the substrate-embedded electronic component 100A according to an example can be changed within a range that can be implemented by those skilled in the art. For example, materials, manufacturing orders, and/or manufacturing methods of each configuration may be changed.

Figure 10:
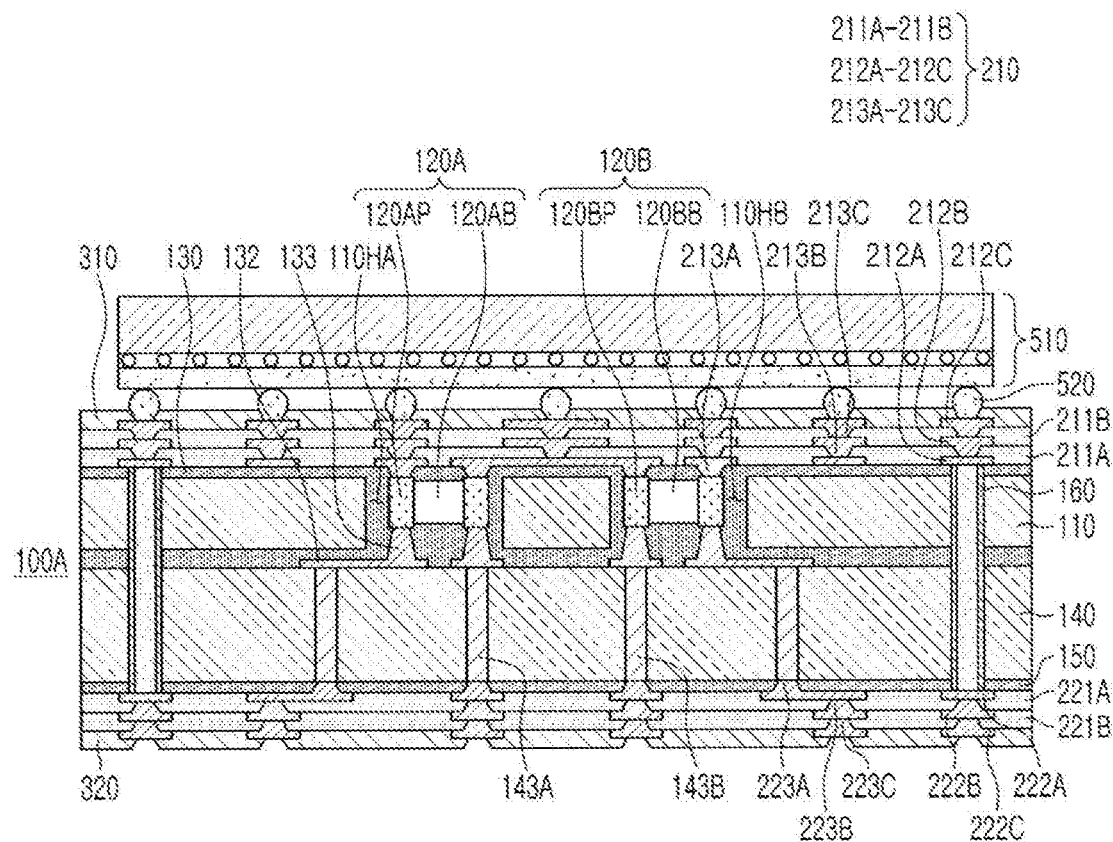
FIG. 10 is a schematic cross-sectional view illustrating an example of a case in which a semiconductor package is mounted on the substrate-embedded electronic component according to an example.

FIG. 10 is a schematic cross-sectional view of an example in which a semiconductor package 510 is mounted on a substrate-embedded electronic component 100A according to an example.

Referring to FIG. 10, the semiconductor package 510 may be mounted on the first build-up layer 210 through a connection terminal 520. Therefore, semiconductor chips in the semiconductor package 510 may be electrically connected to the substrate-embedded electronic component 100A according to an example.

In the example embodiments, the term "connected" may not only refer to "directly connected" but also include "indirectly connected" by means of an adhesive layer, or the like. Also, the term "electrically connected" may include both of the case in which elements are "physically connected" and the case in which elements are "not physically connected." Further, the terms "first," "second," and the like may be used to distinguish one element from the other, and may not limit a sequence and/or an importance, or others, in relation to the elements. In some cases, a first element may be referred to as a second element, and similarly, a second element may be referred to as a first element without departing from the scope of right of the example embodiments.

In the example embodiments, the term "example embodiment" may not refer to one same example embodiment, but may be provided to describe and emphasize different unique features of each example embodiment. The above suggested example embodiments may be implemented do not exclude the possibilities of combination with features of other example embodiments. For example, even though the features described in one example embodiment are not described in the other example embodiment, the description may be understood as relevant to the other example embodiment unless otherwise indicated.

The terms used in the example embodiments are used to simply describe an example embodiment, and are not intended to limit the present disclosure. A singular term includes a plural form unless otherwise indicated.

As set forth above, as one effect among various effects of the present disclosure, it is possible to provide a substrate-embedded electronic component having improved heat dissipation performance.

As another effect among various effects of the present disclosure, it is possible to provide a substrate-embedded electronic component utilizing a region other than a region in which an electronic component in a substrate is mounted.

While the example embodiments have been shown and described above, it will be apparent to those skilled in the art that modifications and variations could be made without departing from the scope of the present invention as defined by the appended claims.

What is claimed is:

1. A substrate-embedded electronic component, comprising:
   a first core layer;
   a first through-portion penetrating the first core layer;
   a first electronic component disposed in the first through-portion;
   an encapsulant disposed in at least a portion of the first through-portion, and covering at least a portion of the first electronic component;
   a second core layer disposed on the encapsulant;
   a first through-via penetrating the second core layer;
   a first conductive via penetrating at least a portion of the encapsulant, and connected to the first electronic component; and
   a first conductive pattern buried in the encapsulant, and connected to the first conductive via,
   wherein the first through-via is connected to the first electronic component,
   the first electronic component is connected to the first through-via through the first conductive via and the first conductive pattern,
   the first electronic component comprises a first body and a first electrode pad, and
   the first through-via is connected to the first body of the first electronic component.

2. The substrate-embedded electronic component of claim 1, further comprising:
   a second through-portion penetrating the first core layer, and disposed to be spaced apart from the first through-portion;
   a second electronic component disposed in the second through-portion; and
   a second through-via penetrating the second core layer,
   wherein the encapsulant is disposed in at least a portion of the second through-portion, and covers at least a portion of the second electronic component, and
   the second through-via is connected to the second electronic component.

3. The substrate-embedded electronic component of claim 2, further comprising a first build-up layer disposed on the second core layer, and including a first metal layer.

4. The substrate-embedded electronic component of claim 3, wherein the second electronic component comprises a second body and a second electrode pad.

5. The substrate-embedded electronic component of claim 4, wherein and the second through-via is connected to the second body of the second electronic component.

6. The substrate-embedded electronic component of claim 5, wherein the first metal layer comprises a first metal pattern connected to the first through-via, and a second metal pattern connected to the second through-via.

7. The substrate-embedded electronic component of claim 1, further comprising:
   a second through-portion penetrating the first core layer, and disposed to be spaced apart from the first through-portion; and
   a second electronic component disposed in the second through-portion,
   wherein the encapsulant is disposed in at least a portion of the second through-portion, and covers at least a portion of the second electronic component, and
   the first through-via is connected to a body of the second electronic component.

8. The substrate-embedded electronic component of claim 7, further comprising a first build-up layer disposed on the second core layer, and including a first metal layer connected to the first through-via.

9. The substrate-embedded electronic component of claim 8, further comprising a second build-up layer disposed on the first core layer, and including a second metal layer.

10. The substrate-embedded electronic component of claims 9, further comprising a third through-via penetrating the first core layer, the encapsulant, and the second core layer, wherein the third through-via connects the first metal layer and the second metal layer.

11. The substrate-embedded electronic component of claim 9, wherein a thickness of each of the first and second core layers is greater than a thickness of each of the first and second build-up layers.

12. A substrate-embedded electronic component, comprising:
   a first core layer;
   a first through-portion penetrating the first core layer;
   a first electronic component disposed in the first through-portion;
   an encapsulant disposed in at least a portion of the first through-portion, and covering at least a portion of the first electronic component;
   a second core layer disposed on the encapsulant;
   a first through-via penetrating the second core layer;
   a first conductive via penetrating at least a portion of the encapsulant, and connected to the first electronic component; and
   a first conductive pattern buried in the encapsulant, and connected to the first conductive via,
   wherein the first through-via is connected to the first electronic component,
   the first electronic component is connected to the first through-via through the first conductive via and the first conductive pattern, the first electronic component comprises a first body and a first electrode pad, and the first through-via is connected to the first electrode pad of the first electronic component.

13. The substrate-embedded electronic component of claim 12, further comprising:

a second through-portion penetrating the first core layer, and disposed to be spaced apart from the first through-portion;

a second electronic component disposed in the second through-portion; and a second through-via penetrating the second core layer, wherein the encapsulant is disposed in at least a portion of the second through-portion, and covers at least a portion of the second electronic component, the second through-via is connected to the second electronic component, the second electronic component comprises a second body and a second electrode pad, the second through-via is connected to the second electrode pad of the second electronic component.

14. The substrate-embedded electronic component of claim 13, wherein the first metal layer comprises a first metal pattern connected to the first through-via, and a second metal pattern connected to the second through-via.

15. The substrate-embedded electronic component of claim 13, wherein the first metal layer comprises a first metal pattern connecting the first through-via and the second through-via.

16. A substrate-embedded electronic component comprising:

a core layer;

a through-portion penetrating the core layer;

an electronic component disposed in the through-portion;

an encapsulant disposed in at least a portion of the through-portion, and covering at least a portion of the electronic component;

a build-up layer disposed on an upper side of the encapsulant, and including a metal layer connected to a pad of the electronic component;

an insulating layer disposed on a lower side of the encapsulant opposing the upper side thereof;

a through-via penetrating the insulating layer; and a conductive structure including a conductive via and a conductive pattern, and embedded in the encapsulant connecting the through-via and the electronic component to each other, wherein the conductive structure and the metal layer are made of different materials, and the conductive structure is connected to a body or the pad of the electronic component.

* * * * *